(12) United States Patent
Nation et al.

(10) Patent No.: US 7,331,031 B2
(45) Date of Patent: Feb. 12, 2008

(54) METHOD FOR DESCRIBING AND DEPLOYING DESIGN PLATFORM SETS

(75) Inventors: George W. Nation, Rochester, MN (US); Jeremy C. White, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 355 days.

(21) Appl. No.: 11/071,623

(22) Filed: Mar. 3, 2005

(65) Prior Publication Data
US 2006/0200788 A1    Sep. 7, 2006

(51) Int. Cl.
*G06F 17/50* (2006.01)
(52) U.S. Cl. .................... 716/18; 716/17; 716/2; 716/3; 716/7
(58) Field of Classification Search .......... 716/18, 716/17, 2, 3, 7
See application file for complete search history.

(56) References Cited

U.S. PATENT DOCUMENTS

| | | | |
|---|---|---|---|
| 5,910,898 A * | 6/1999 | Johannsen | 716/1 |
| 6,578,176 B1 * | 6/2003 | Wang et al. | 716/2 |
| 6,615,167 B1 * | 9/2003 | Devins et al. | 703/28 |
| 7,017,043 B1 * | 3/2006 | Potkonjak | 713/176 |
| 7,065,481 B2 * | 6/2006 | Schubert et al. | 703/14 |
| 7,092,864 B2 * | 8/2006 | Roesner et al. | 703/14 |
| 7,143,376 B1 * | 11/2006 | Eccles | 716/5 |
| 7,207,015 B1 * | 4/2007 | Ballagh et al. | 716/3 |
| 2002/0111952 A1 * | 8/2002 | Tu et al. | 707/101 |
| 2006/0085781 A1 * | 4/2006 | Rapp et al. | 716/17 |
| 2006/0230377 A1 * | 10/2006 | Rapp et al. | 716/18 |

* cited by examiner

*Primary Examiner*—Phallaka Kik
(74) *Attorney, Agent, or Firm*—Christopher P. Maiorana PC

(57) ABSTRACT

A method for realization of an integrated circuit design including the steps of (i) receiving one or more design platform descriptions and (ii) merging the one or more design platform descriptions into one or more layers of a design flow. The one or more design platform descriptions provide design information about one or more platforms capable of instantiating the integrated circuit design.

20 Claims, 6 Drawing Sheets

METHOD FOR DESCRIBING AND DEPLOYING DESIGN PLATFORM SETS

FIELD OF THE INVENTION

The present invention relates to integrated circuit design generally and, more particularly, to a method for describing and deploying design platform sets.

BACKGROUND OF THE INVENTION

The electronic design automation (EDA) tool and intellectual property (IP) core industries have a number of design systems for describing and packaging IP cores for deployment. When these design systems and corresponding core library descriptions are used to assemble designs there is no context or description for the underlying silicon platform upon which the design will be instantiated.

For application specific integrated circuits (ASICs), the disadvantage of the missing context is an uncertainty in the size of the resulting die, number of IO, etc. For structured ASIC platforms, the disadvantage is more pronounced because resources are fixed.

It would be desirable to have a solution for describing platform capabilities in a standard way that can be deployed to third party tools.

SUMMARY OF THE INVENTION

The present invention concerns a method for realization of an integrated circuit design including the steps of (i) receiving one or more design platform descriptions and (ii) merging the one or more design platform descriptions into one or more layers of a design flow. The one or more design platform descriptions provide design information about one or more platforms capable of instantiating the integrated circuit design.

The objects, features and advantages of the present invention include providing a method for describing and deploying design platform sets that may (i) provide an XML description of a design platform, (ii) be compatible with existing, standard schema, (e.g., SPIRIT, Platform Express™ (from Mentor Graphics), etc.), (iii) implement additional elements to denote platform content and features and/or (iv) provide descriptions including the properties of structured ASIC silicon platforms.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
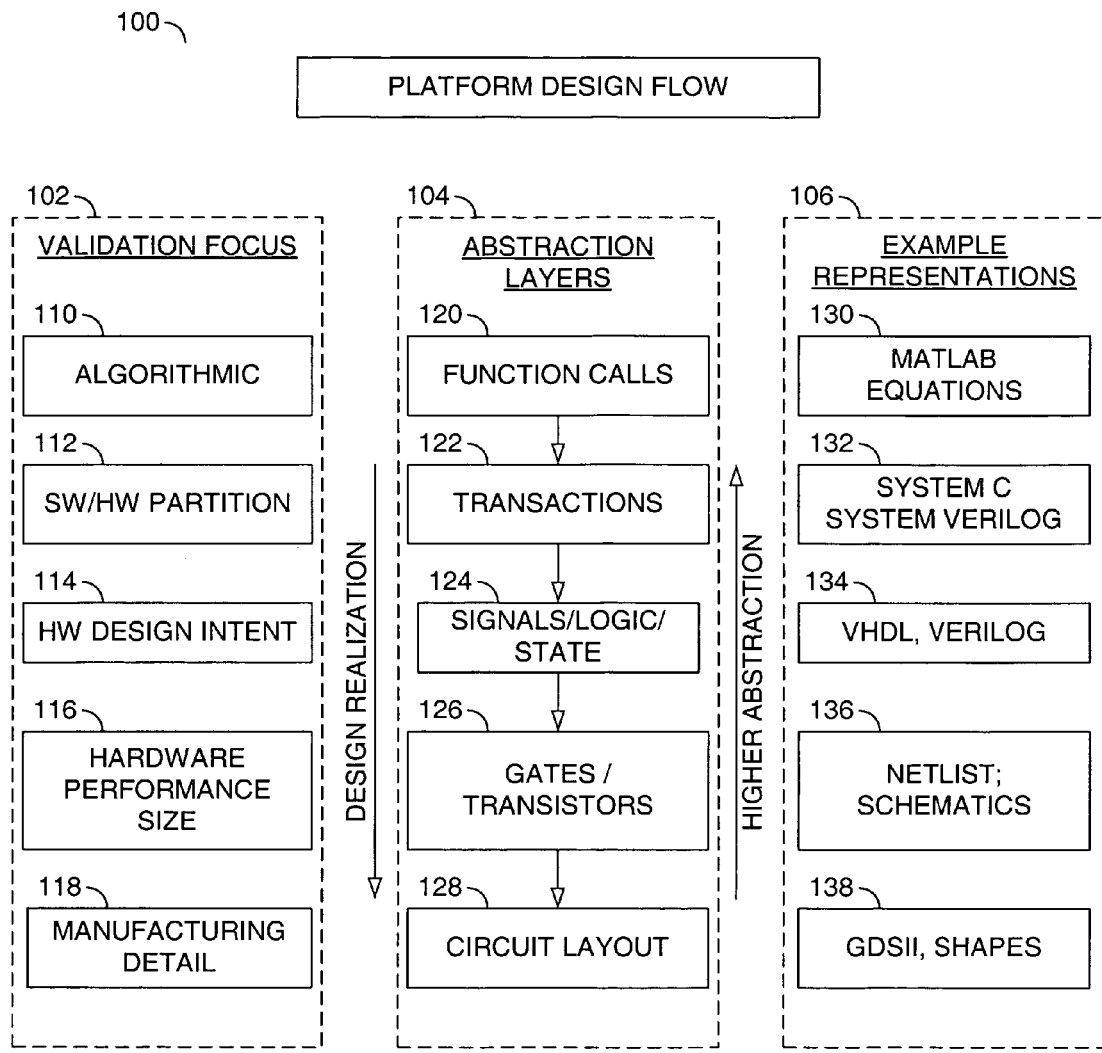
FIG. 1 is a flow diagram illustrating an example platform design flow.

Referring to FIG. 1, a flow diagram 100 is shown illustrating an example platform design flow in accordance with a preferred embodiment of the present invention. The design flow 100 may comprise three partitions: a validation focus 102, abstraction layers 104 and example representations 106. The validation focus 102 may be comprise (i) an algorithmic stage 110, a software and hardware (SW/HW) partition 112, a hardware design intent stage 114, a hardware performance size stage 116 and manufacturing detail stage 118.

The abstraction layers 104 of the platform design flow 100 may comprise a number of levels corresponding to the stages of the validation focus 102. In one example, the abstraction layers may comprise (i) function calls 120, (ii) transactions 122, (iii) signals, logic and states 124, (iv) gates and transistors 126 and (v) circuit layout 128. The platform design flow 100 generally moves through the abstraction layers starting with function calls 120 and moving towards the circuit layout 128 as a design is realized. In general, the earlier in the design flow a design realization step occurs, the higher the abstraction of the design realization step.

A number of representations 106 may be used for the abstraction layers 104. In one example, the function calls abstraction layer 120 may be represented by MATLAB® equations 130 (MATLAB is a registered trademark of The MathWorks, Inc., Natick, Mass.). The transactions abstraction layer 122 may be represented in system C or system verilog (e.g., block 132). The signals, logic and states abstraction layer 124 may be represented in VHDL and/or verilog (e.g., block 134). The gates and transistor abstraction layer 126 may be represented using netlists and/or schematics (e.g., block 136). The circuit layout abstraction layer 128 may be represented using GDSII and/or shapes (e.g., block 138). However, other representations may be implemented accordingly to meet design criteria of a particular implementation.

Figure 2:
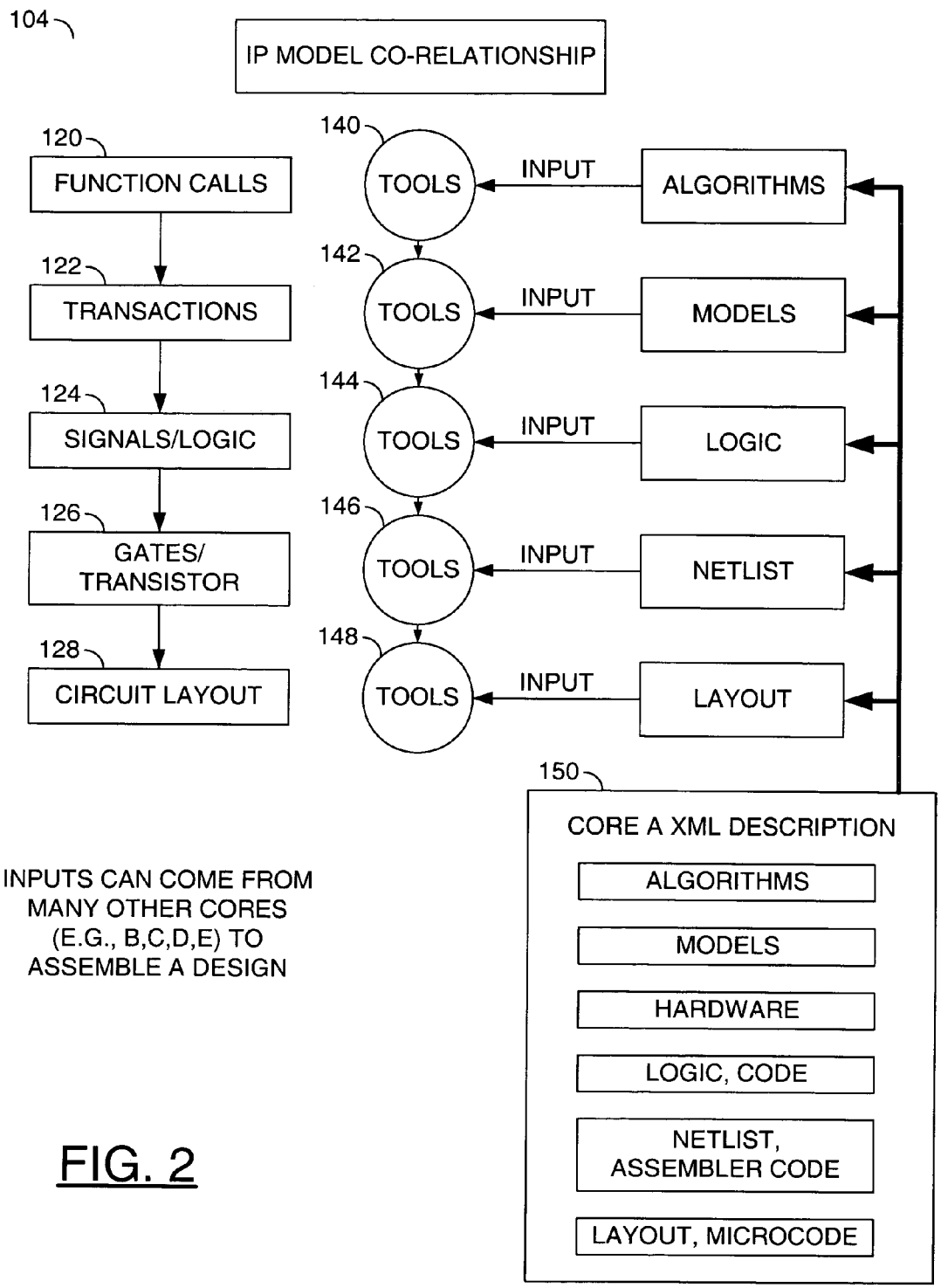
FIG. 2 is a more detailed diagram of a design flow.

Referring to FIG. 2, a more detailed flow diagram of the abstraction layers 104 is shown illustrating an IP model co-relationship in accordance with a preferred embodiment of the present invention. In one example, each of the abstraction layers may be implemented with one or more tools. For example, the function calls abstraction layer 120 may be implemented with tools 140. The transactions abstraction layer 122 may be implemented with tools 142. The signals, logic and states abstraction layer 124 may be implemented with tools 144. The gates and transistor abstraction layer 126 may be implemented with tools 146. The circuit layout abstraction layer 128 may be implemented with tools 148. The tools 140-148 may be implemented with conventional techniques.

In a preferred embodiment, the present invention may provide a core description 150 (e.g., for a core A) in extensible mark-up language (XML). The core XML description may comprise description information that may be used as inputs to one or more of the tools implementing the abstraction layers 104 of the design flow 100. Tn one example, the core XML description may comprise information regarding (i) algorithms, (ii) models, (iii) hardware, (iv) logic and/or code, (v) netlist and/or assembler code and (vi) layout and/or microcode. Although a number of examples of information are illustrated, the core XML description is not limited to the specific examples presented.

In general, the tools assembled at each of the abstraction layers 104 may be configured to use inputs from a plurality of core descriptions 150 to assemble a design. The core descriptions 150 comprise, in one example, XML descriptions of the properties and characteristics of a particular core. Each of the core descriptions may be plugged together to form a bigger design.

In one embodiment, the present invention may provide an XML description compatible with existing, standard schema, such as SPIRIT, Platform Express™ from Mentor Graphics, and/or other electronic design automation tools or tool suites. The present invention generally provides additional elements in the XML descriptions to denote platform content and features. The description may comprise one or more of the following properties of structured ASIC silicon platforms: (i) TO buffers (e.g., number per side, configurability, etc.), (ii) Logic capability (e.g., technology, speed restrictions, capacity, library, etc.), (iii) Memory (e.g., content, quantity, types, mm/max capabilities, etc.), (iv) Diffused content (e.g., IP inventory, versions, etc.), (v) Landing zones (e.g., types, content, etc.), (vi) Package (e.g., description, IO-to-pin mapping, etc.) and (vii) Clock resources (e.g., PLLs, capabilities, etc.). Other descriptive information for the silicon platform also may be included (e.g., X/Y dimensions, system-specific placement detail, etc.). However, not all of the information may be useful or advantageous to present to the designer or to competitors.

In one embodiment, the present invention generally provides a process for deploying platform descriptions in a standardized format. In one example, the platform descriptions may be deployed similarly to third party IP. In one example, the platform descriptions may be deployed using one or more types of computer readable media (e.g., as part of a core library, on a magnetic disk, CD, and/or DVD, via network download, etc.). The platform descriptions in accordance with the present invention may enable the EDA industry to increase an added value to structured ASIC customers. For example, the present invention may provide tools that allow designers to not only assemble designs, but to assemble them in the context of a particular structured ASIC platform or family of platforms. In one embodiment, the present invention may provide platform descriptions expressible as an extension or addition to the SPIRIT (Structure for Packaging, Integrating and Re-Using IP within Tool-flows) Consortium schema.

In general, the tools 140-148 represent available EDA industry tools configured to work at the respective abstraction layers. For example, in a fairly complex design (e.g., where one part of the design performs control flow or processor oriented control flow for operating on data and another part of the design performs data streaming or data driven operations on data) multiple different tools may be used to facilitate the design at a particular abstraction level (e.g., Function calls). For example, different tools may be utilized to design the control flow and the data flow portions of the design separately. However, at a subsequent layer of abstraction to realizing the design (e.g., the transactional layer), one tool may be sufficient to perform the tasks at that transaction level.

In general, the present invention may be implemented with multiple tools at a given layer of abstraction, with each of those tools having a respective output. The multiple outputs may be imported into one or possibly more tools down at the next layer of abstraction. For example, instead of one stream of data going down through the abstractions layers, multiple streams of data may be merging all the way down to one final design in the end. For example, a chip is generally manufactured at one location and a single tool may be used to draw all the rectangles. In general, the present invention may facilitate a physical design tool flow that may import multiple design descriptions. For example, the deliverables of core A in FIG. 2 and the deliverables of a design platform description (described in connection with FIG. 3 below) may be deployed and made available to every layer of abstraction in a design flow. Two or more extended design descriptions may be merged at one or more layers of the design flow.

As used herein, logic generally refers to hardware, code generally refers to software (e.g., C code, etc.), and netlist generally refers to the hardware analog to assembler code. In one example, deliverables as used herein may refer to one or more of code, logic, assembler code, and netlists. In another example, deliverables may also refer to layout information and even microcode for one or more cores. In one example, code may comprise a driver routine for a particular piece of hardware, a device driver for a particular piece of hardware, a diagnostic code to run to make sure the corresponding logic is connected properly, etc.

Figure 3:
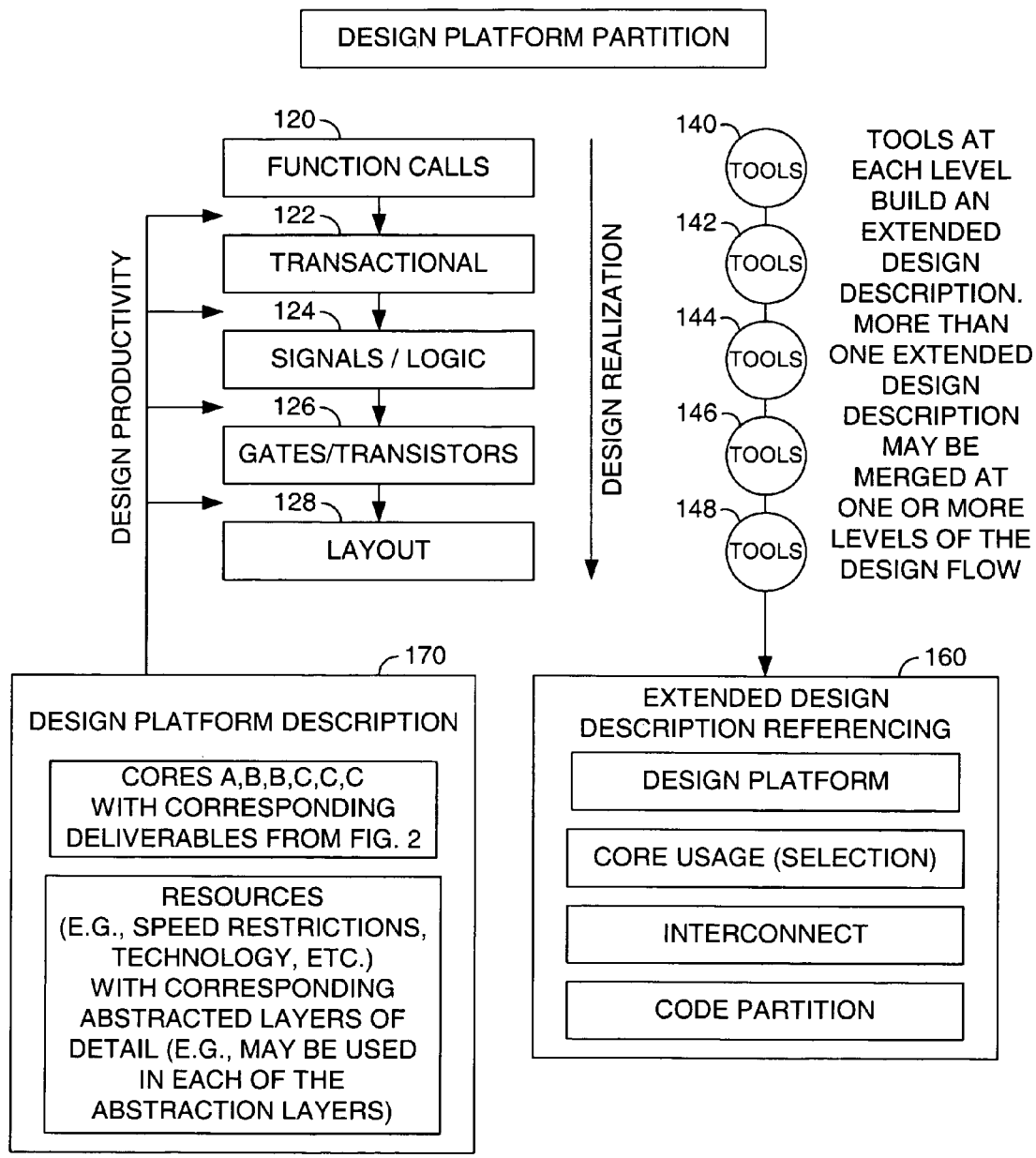
FIG. 3 is a diagram illustrating a design platform partition in accordance with a preferred embodiment of the present invention.

Referring to FIG. 3, a block diagram is shown illustrating a design platform partition scheme in accordance with a preferred embodiment of the present invention. In one example, the present invention may provide an extended design description referencing structure (or scheme) 160 for use in design realization. Specifically, the extended design description referencing scheme 160 in accordance with a preferred embodiment of the present invention may include description regarding (i) design platform, (ii) core usage (or selection), (iii) interconnection and (iv) code partitioning. In general, tools at each level of the abstraction layers 104 (e.g., function calls, transactions, signals/logic, transistors/gates, circuit layout, etc.) may be configured to build a design description.

In another aspect, the present invention may provide a design platform description 170 describing resource support of a particular platform. In one example, the design platform description 170 may include information regarding the number and types of cores that may be supported by the platform (e.g., along with corresponding deliverables such as algorithms, models, logic, netlist, layout, etc.). The design platform description 170 may also include information regarding resources of the particular platform. The resource descriptions may include details for corresponding abstracted layers. For example, the resource description may comprise information regarding: (i) IO buffers (e.g., number per side, configurability, etc.), (ii) Logic capability (e.g., technology, speed restrictions, capacity, library, etc.), (iii) Memory (e.g., content, quantity, types, min/max capabilities, etc.), (iv) Diffused content (e.g., IP inventory, versions, etc.), (v) Landing zones (e.g., types, content, etc.), (vi) Package (e.g., description, IO-to-pinmapping, etc.) and (vii) Clock resources (e.g., PLLs, capabilities, etc.) supported by the platform. Other descriptive information for the silicon platform also be included (e.g., X/Y dimensions, system-specific placement detail, etc.). In general, the design platform description provides information about a particular hardware platform that cores may be plugged into to realize the design. For example, the platform may be viewed as a holder or carrier for the design.

Figure 4:
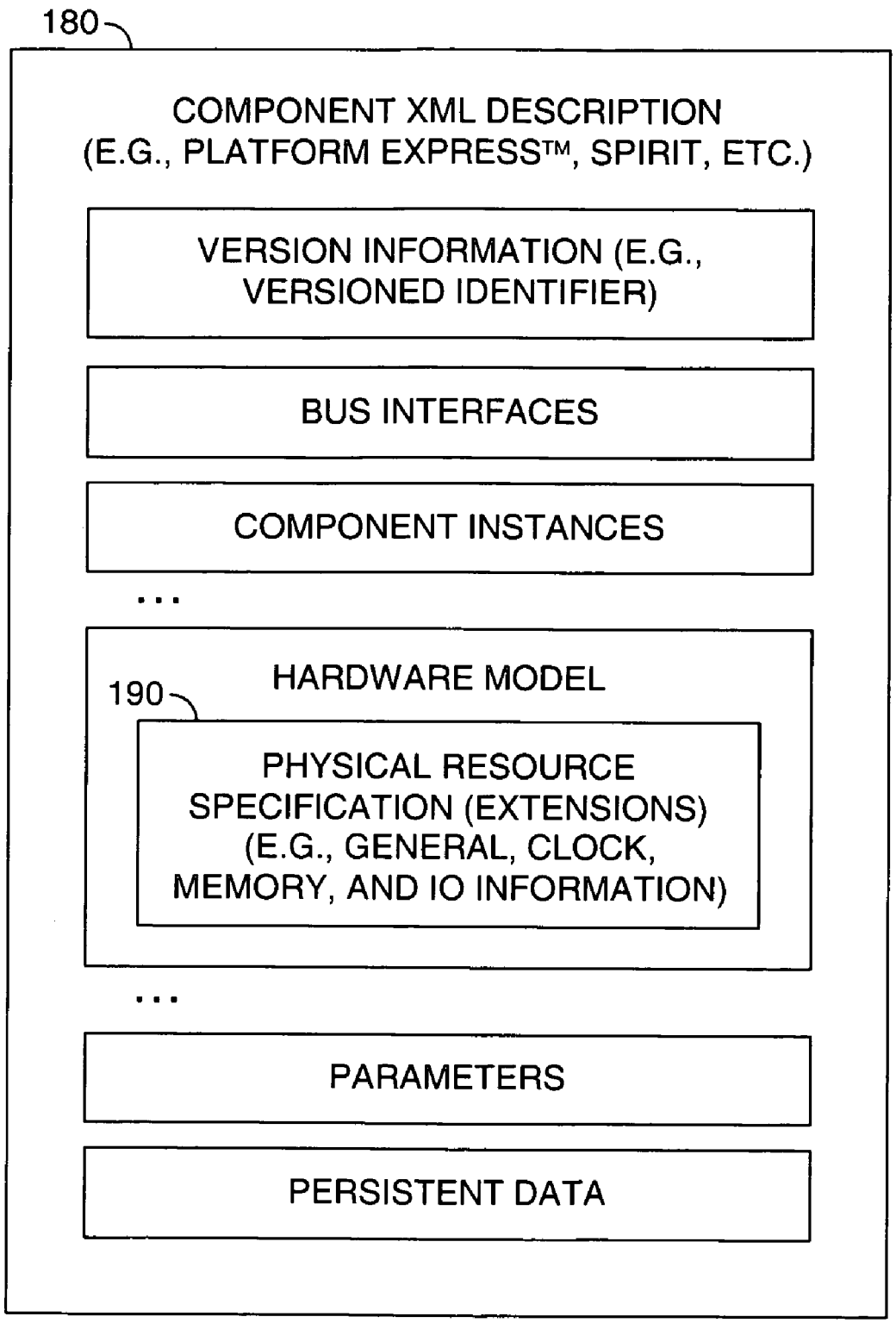
FIG. 4 is a block diagram illustrating an example component description in accordance with a preferred embodiment of the present invention.

Referring to FIG. 4, a block diagram is shown illustrating a component XML description block 180 in accordance with a preferred embodiment of the present invention. In one example, the component XML description block 180 may be compliant with an electronic design automation tool such as Platform Express™ from Mentor Graphics. In one example, the component XML description 180 may include version information (e.g., versioned identifier), bus interface descriptions, descriptions of component instances, hardware model description, parameters and persistent data. The hardware model description of the component XML description 180 is generally extended by including a physical resource specification extension 190 as described herein. For example, a hardware model description in accordance with a preferred embodiment of the present invention may include, but is not limited to, information regarding any or all of (i) IO buffers (e.g., number per side, configurability, etc.), (ii) Logic capability (e.g., technology, speed restrictions, capacity, library, etc.), (iii) Memory (e.g., content, quantity, types, min/max capabilities, etc.), (iv) Diffused content (e.g., IP inventory, versions, etc.), (v) Landing zones (e.g., types, content, etc.), (vi) Package (e.g., description, IO-to-pinmapping, etc.) and (vii) Clock resources (e.g., PLLs, capabilities, etc.) supported by the platform. Other descriptive information for the silicon platform may also be included (e.g., X/Y dimensions, system-specific placement detail, etc.).

Figure 5:
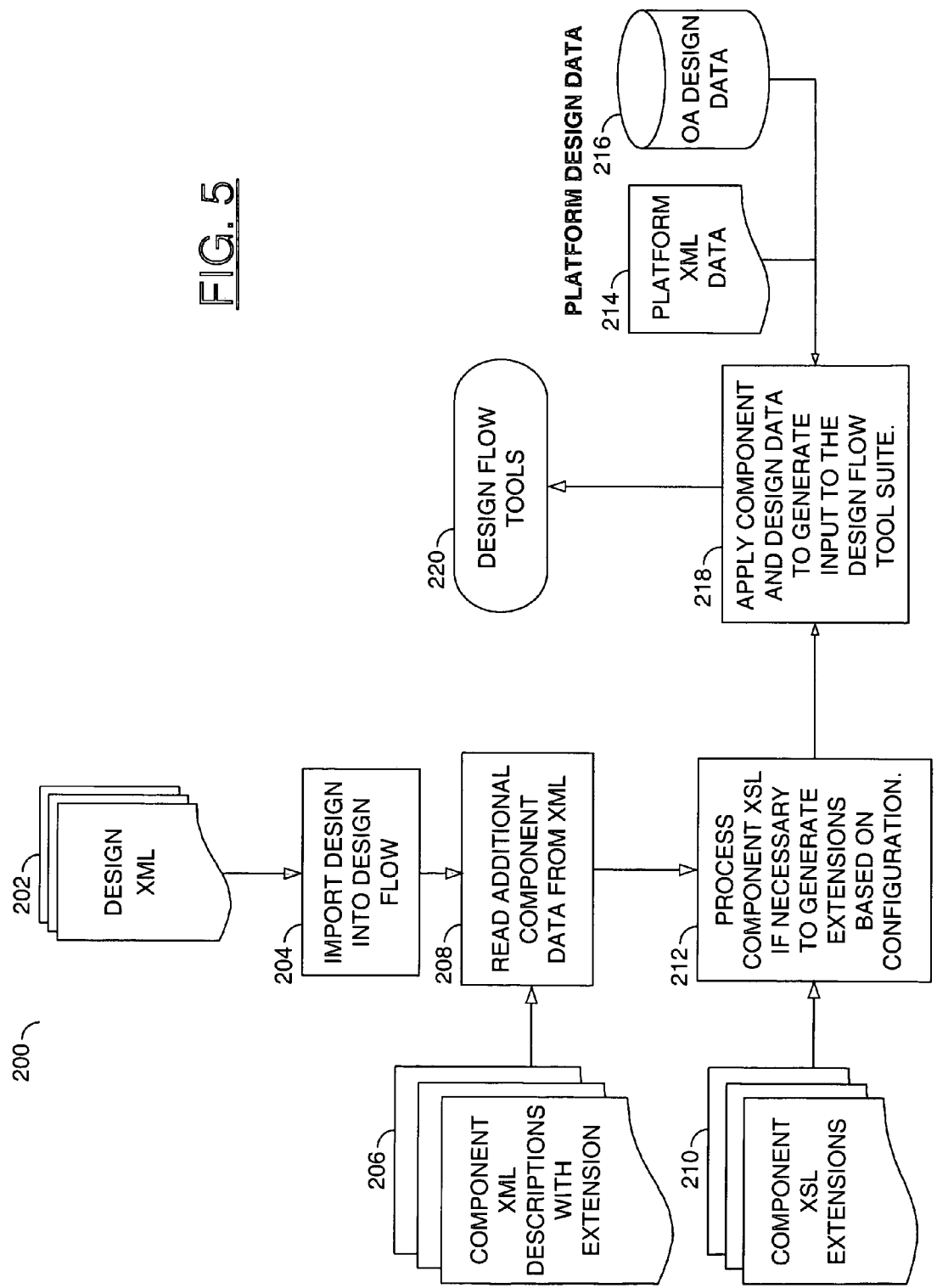
FIG. 5 is a flow diagram illustrating an example data flow in accordance with a preferred embodiment of the present invention.

Referring to FIG. 5, a flow diagram 200 is shown illustrating an example design data flow in accordance with the preferred embodiment of the present invention. In one example, the design flow 200 may begin with one or more sets of design data 202. The design data 202 is generally imported into the design flow 200 (e.g., block 204). Components may be extracted from the design and cross-referenced with static component descriptions 206 (e.g., block 208). In one example, component extensible style sheet language (XSL) extensions 210 may be optionally invoked to generate extensions (XML transformations) based on component configuration (e.g., block 212). The component and design data (along with any extensions generated) are generally processed with platform XML data 214 and OA design data 216 (e.g., block 218). In one example, requests may be made to other tools in the design flow based on the extensions (e.g., block 220).

Figure 6:
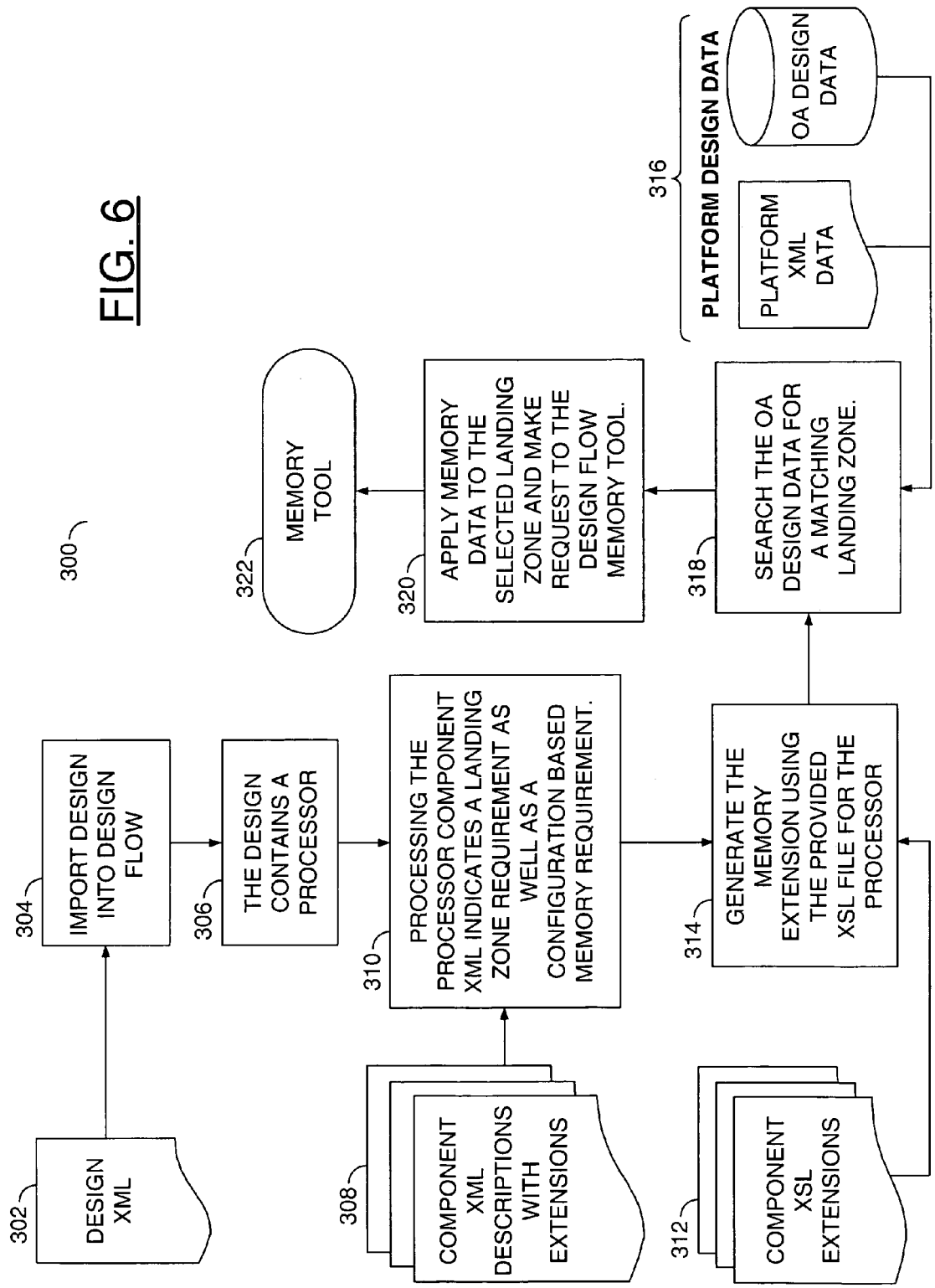
FIG. 6 is a flow diagram illustrating another example data flow.

Referring to FIG. 6, a flow diagram 300 is shown illustrating an example design data flow for a design including a processor instance. In one example, the design flow of FIG. 5 may be applied to a design 302 containing a processor instantiated in a programmable transistor fabric of a programmable platform device (e.g., a structured ASIC). The design 302 is generally imported (entered) into a design flow in accordance with the present invention (e.g., block 304). The design data may be examined and the presence of the processor detected (e.g., block 306). Data regarding the processor may be referenced in a static component XML description 308. In one example, the component XML description 308 for the processor may include a landing zone specification and a configuration based memory specification (e.g., block 310). For example, the design flow may determine that the processor uses a diffused memory pattern as a landing zone and that the memory extension is to be generated using XSL based on the configuration.

The memory extension may be generated using a memory component XSL extension 312 for the processor (e.g., block 314). Design data for the platform 316 may be examined to determined whether a suitable landing zone exists on the chosen platform (e.g., block 318). The selected landing zone may be applied to the memory extension data (e.g., block 320) and memory reservations made using a memory tool of the design flow (e.g., block 322). In general, the design flow in accordance with the present invention may be implemented with one or more physical design tools or a suite of physical design tools.

The function (or operations) performed by the present invention may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, ASSPs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for realization of an integrated circuit design comprising:
   receiving one or more design platform descriptions, wherein said one or more design platform descriptions comprise physical resource specification extensions for one or more platforms capable of instantiating one or more cores of an integrated circuit design; and
   merging said one or more design platform descriptions into one or more abstraction layers of a design flow.

2. The method according to claim 1, wherein said one or more design platform descriptions are configured to link one or more core descriptions into a design platform.

3. The method according to claim 1, wherein said one or more design platform descriptions are used at a plurality of abstraction layers of said design flow.

4. The method according to claim 1, wherein said one or more design platform descriptions comprise resource descriptions comprising information regarding resources of a respective platform selected from the group consisting of IO buffers, logic capabilities, memory content, diffused content, landing zones, packaging, and clock resources.

5. The method according to claim 4, wherein said IO buffer descriptions comprise one or more types of information selected from the group consisting of number per side and configurability.

6. The method according to claim 4, wherein said logic capabilities descriptions comprise one or more types of information selected from the group consisting of capability, technology, speed, capacity and library.

7. The method according to claim 4, wherein said memory content descriptions comprise one or more types of information selected from the group consisting of content, quantity, types, minimum capabilities and maximum capabilities.

8. The method according to claim 4, wherein said diffused content descriptions comprise one or more types of information selected from the group consisting of IP inventory and versions.

9. The method according to claim 4, wherein said landing zone descriptions comprise one or more types of information selected from the group consisting of types and content.

10. The method according to claim 4, wherein said packaging descriptions comprise one or more types of information selected from the group consisting of package description and IO-to-pin mapping.

11. The method according to claim 4, wherein said clock resource descriptions comprise one or more types of information selected from the group consisting of presence and number of PLLs and capabilities.

12. An apparatus comprising:
a first circuit configured to receive one or more design platform descriptions, wherein said one or more design platform descriptions comprise physical resource specification extensions for one or more platforms capable of instantiating one or more cores of an integrated circuit design; and
a second circuit configured to merge said one or more design platform descriptions into one or more abstraction layers of a design flow.

13. The apparatus according to claim 12, wherein said design platform descriptions are deployed using one or more computer readable media.

14. The apparatus according to claim 12, wherein said one or more design platform descriptions are configured to link one or more core descriptions into a design platform.

15. The apparatus according to claim 14, wherein said one or more design platform descriptions are used at a plurality of abstraction layers of said design flow.

16. A method for realization of an integrated circuit design comprising:
receiving one or more extended design platform descriptions, wherein said one or more extended design platform descriptions comprise physical resource specification extensions for one or more platforms capable of instantiating one or more cores of an integrated circuit design; and
merging said one or more extended design descriptions into one or more abstraction layers of a design flow.

17. The method according to claim 16, wherein said one or more extended design descriptions comprise one or more types of information selected from the group consisting of design platform, core usage, core selection, interconnects and code partitions.

18. The method according to claim 16, further comprising:
building one or more extended design descriptions at said one or more abstraction levels of said design flow.

19. The method according to claim 16, further comprising:
extending a physical resource specification of a component extensible mark-up language (XML) description with one or more types of information selected from the group consisting of clock information, memory information and IO information.

20. The method according to claim 19, wherein said physical resource specification of a component extensible mark-up language (XML) description is used at one or more abstraction layers of said design flow.

* * * * *